United States Patent
Morovic et al.

(10) Patent No.: US 10,424,109 B2
(45) Date of Patent: Sep. 24, 2019

(54) THREE-DIMENSIONAL OBJECT REPRESENTATION

(71) Applicant: Hewlett-Packard Development Company, L.P., Houston, TX (US)

(72) Inventors: Peter Morovic, Sant Cugat del Valles (ES); Jan Morovic, Colchester (GB); Juan Manuel Garcia Reyero Vinas, Sant Cugat del Valles (ES); Scott White, Barcelona (ES); Jun Zeng, Sunnyvale, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 58 days.

(21) Appl. No.: 15/544,775

(22) PCT Filed: Apr. 24, 2015

(86) PCT No.: PCT/US2015/027593
§ 371 (c)(1),
(2) Date: Jul. 19, 2017

(87) PCT Pub. No.: WO2016/171730
PCT Pub. Date: Oct. 27, 2016

(65) Prior Publication Data
US 2018/0018815 A1    Jan. 18, 2018

(51) Int. Cl.
*G06T 15/00*   (2011.01)
*G06T 17/00*   (2006.01)
(Continued)

(52) U.S. Cl.
CPC .............. *G06T 17/00* (2013.01); *B33Y 50/00* (2014.12); *G06F 17/50* (2013.01); *G06T 2210/56* (2013.01)

(58) Field of Classification Search
CPC ..... B33Y 50/00; G06T 2210/56; G06T 17/00; G06F 17/50
(Continued)

(56) References Cited

U.S. PATENT DOCUMENTS 6,895,371 B1   5/2005  Ames et al.
7,760,201 B2   7/2010  Couture-Gagnon
(Continued)

FOREIGN PATENT DOCUMENTS

EP       1050020        3/2003
WO   WO-2013113372     8/2013

OTHER PUBLICATIONS

Brackett, D., Ashcroft, I. and Hague, R., Aug. 2011, Topology optimization for additive manufacturing. In Proceedings of the solid freeform fabrication symposium, Austin, TX (vol. 1, pp. 348-362). S.*

(Continued)

*Primary Examiner* — Phu K Nguyen
(74) *Attorney, Agent, or Firm* — HP Inc. Patent Department

(57) ABSTRACT

Methods and apparatus relating to three-dimensional object models are described. In one example, (i) data representing a geometrical description of a three-dimensional object defining object geometry in a geometric space and (ii) at least one object property description describing an object property in an object property space are received. The object property space and the geometric space are intersected to define an object model, wherein an object property is defined at an intersection between a described object property and defined object geometry.

15 Claims, 5 Drawing Sheets

(51) Int. Cl.
*B33Y 50/00* (2015.01)
*G06F 17/50* (2006.01)

(58) Field of Classification Search
USPC .......................................................... 345/419
See application file for complete search history.

(56) References Cited

U.S. PATENT DOCUMENTS

| | | | |
|---|---|---|---|
| 7,991,498 B2* | 8/2011 | Kritchman | G05B 15/02 |
| | | | 700/119 |
| 8,515,982 B1 | 8/2013 | Hickman et al. | |
| 8,666,142 B2* | 3/2014 | Shkolnik | G06T 1/00 |
| | | | 382/154 |
| 8,731,887 B2 | 5/2014 | Hilliard et al. | |
| 8,831,366 B1 | 9/2014 | Hickman et al. | |
| 8,963,135 B2* | 2/2015 | Nikonov | H01L 51/0004 |
| | | | 257/40 |
| 2001/0027456 A1 | 10/2001 | Lancaster et al. | |
| 2007/0270705 A1 | 11/2007 | Starks | |
| 2010/0125356 A1* | 5/2010 | Shkolnik | G06T 1/00 |
| | | | 700/98 |
| 2010/0195122 A1* | 8/2010 | Kritchman | G05B 15/02 |
| | | | 358/1.9 |
| 2012/0069011 A1 | 3/2012 | Hurt et al. | |
| 2013/0297059 A1* | 11/2013 | Grifith | G06F 17/50 |
| | | | 700/98 |
| 2014/0152383 A1* | 6/2014 | Nikonov | H01L 51/0004 |
| | | | 327/564 |
| 2014/0254921 A1 | 9/2014 | Arcas et al. | |
| 2014/0324204 A1 | 10/2014 | Vidimce et al. | |
| 2015/0091208 A1 | 4/2015 | Sadusk et al. | |
| 2016/0151979 A1* | 6/2016 | Urban | B29C 67/0088 |
| | | | 264/308 |

OTHER PUBLICATIONS

Brackett, D., et al., "A Dithering Based Method to Generate Variable vol. Lattice Cells for Additive Manufacturing", 22Nd Annual International Solid Freeform Fabrication Symposium [online], 2011 [retrieved Aug. 29, 2017], Retrieved from Internet: , pp. 671-679.*
Cutler B, Dorsey J, McMillan L, Müller M, Jagnow R. A procedural approach to authoring solid models. InACM Transactions on Graphics (TOG) Jul. 23, 2002 (vol. 21, No. 3, pp. 302-311). ACM.*
Doubrovski EL, Tsai EY, Dikovsky D, Geraedts JM, Herr H, Oxman N. Voxel-based fabrication through material property mapping: A design method for bitmap printing. Computer-Aided Design. Mar. 1, 2015;60:3-13.*
International Search Report and Written Opinion dated Dec. 22, 2015, PCT Patent Application No. PCT/US2015/027593, filed Apr. 24, 2015, Korean Intellectual Property Office.
Ran Gal and Daniel Cohen-Or, "Salient Geometric Features for Partial Shape Matching and Similarity", Tel-Aviv University, Dec. 18, 2005. http://research.microsoft.com/en-us/um/people/rgal/publications/papers/salient-reduced.pdf.

* cited by examiner

THREE-DIMENSIONAL OBJECT REPRESENTATION

CLAIM FOR PRIORITY

The present application is a national stage filing under 35 U.S.C. § 371 of PCT application number PCT/US2015/027593, having an international filing date of Apr. 24, 2015, the disclosure of which is hereby incorporated by reference in its entirety.

BACKGROUND

Three-dimensional objects generated by an additive manufacturing process may be formed in a layer-by-layer manner. In one example of additive manufacturing, an object is generated by solidifying portions of layers of build material. In examples, the build material may be in the form of a powder, fluid or sheet material. The intended solidification and/or physical properties may be achieved by printing an agent onto a layer of the build material. Energy may be applied to the layer and the build material on which an agent has been applied may coalesce and solidify upon cooling. In other examples, chemical binding agents may be used to solidify a build material. In other examples, three-dimensional objects may be generated by using extruded plastics or sprayed materials as build materials, which solidify to form an object.

Some printing processes that generate three-dimensional objects use control data generated from a model of a three-dimensional object. This control data may, for example, specify the locations at which to apply an agent to build material, or where a build material itself may be placed, and the amounts to be placed.

The control data may be generated from a 3D representation of an object to be printed.

BRIEF DESCRIPTION OF DRAWINGS

For a more complete understanding, reference is now made to the following description taken in conjunction with the accompanying drawings in which.

DETAILED DESCRIPTION

Some examples described herein provide an apparatus and a method for representing a three-dimensional object and/or for generating control data that may be used to produce a three-dimensional object. Some examples allow arbitrary three-dimensional content with a variety of specified object properties to be processed and used to generate a three-dimensional object. These object properties may comprise appearance properties (color, transparency, glossiness, etc), conductivity, density, porosity and/or mechanical properties such as strength.

In some examples, a print material coverage representation defines print material data, for example detailing the amount of print materials (such as agent(s) to be deposited onto a layer of build material, or in some examples, build materials themselves), and, if applicable, their combinations. In some examples, this may be specified as a proportional volume coverage (for example, X % of a region of a layer of build material should have agent Y applied thereto). Such print materials may be related to or selected to provided an object property such as, for example, color, transparency, flexibility, elasticity, rigidity, surface roughness, porosity, conductivity, inter-layer strength, density, and the like.

The actual location at which each print material (for example, a drop of an agent) should be applied, as specified in control data, may be determined using halftoning techniques.

For example, a set of locations or volumes within object model data may have an associated set of print material coverage vectors. In a simple case, such a vector may indicate that X % of a given region of three-dimensional space should have a particular agent applied thereto, whereas (100-X) % should be left clear of agent. A print material coverage representation may then provide the input for a 'halftoning' process to generate control data that may be used by an additive manufacturing system to produce a three-dimensional object. For example, it may be determined that, to produce specified object properties, 25% of a layer of build material (or of a portion of a layer) should have an agent applied thereto. The halftoning process determines where the drops of agent fall in order to provide 25% coverage, for example by comparing each location to a threshold value provided in a halftone threshold matrix.

Figure 1:
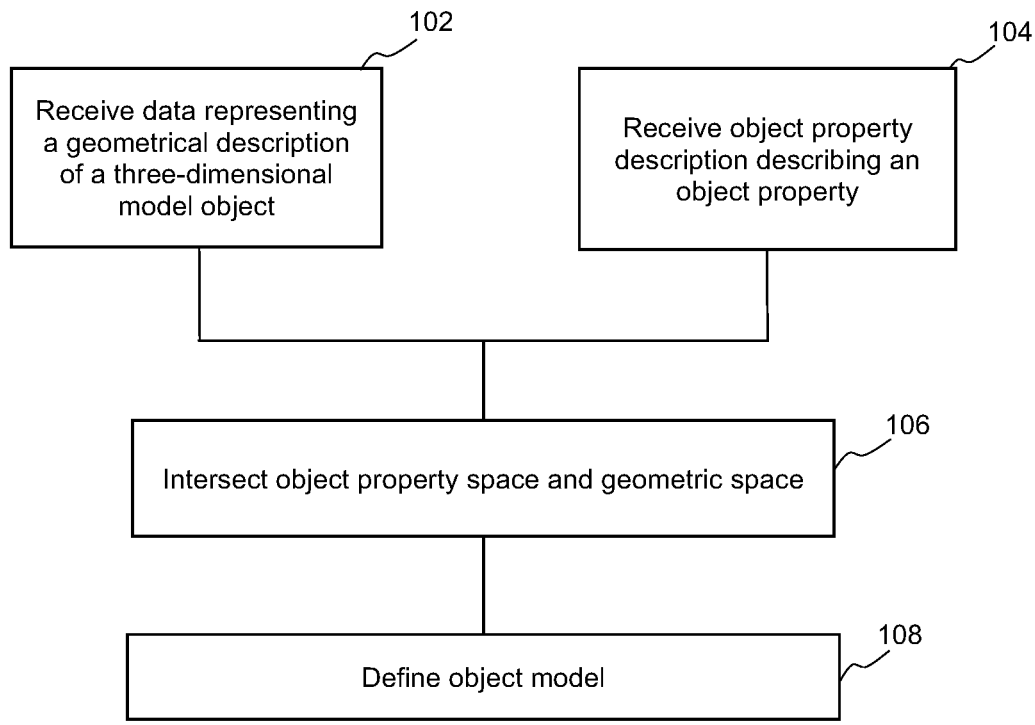
FIG. 1 is a flowchart of an example of a method for defining an object property model.

FIG. 1 is an example of a method for processing data comprising a representation of an object. In block 102, data representing a geometrical description of a three-dimensional object in a geometric space, for example using geometric space coordinates, is received. In some examples, this may comprise an array of 'Voxels', i.e. three-dimensional pixels, wherein each voxel occupies a discrete volume. Such voxels may be all of the same size, or may be different sizes. Other volumetric descriptions may be used. In other examples, three-dimensional space may be characterised as at least one point, for example using a coordinate system such as an [x, y, z] three-dimensional Cartesian coordinate system, or a polar coordinate system. For example, object surfaces may be described in terms of tessellating flat surfaces, such as triangles, by defining the corners (which may be termed the vertices) of the surfaces. Defining the corners also effectively specifies the edges and the (in this example) triangular faces. This allows an object's shape to be approximated, making economical use of computer memory space. The data may for example be the output of a Computer Aided Design (CAD) program, or some other digital representation of a three dimension object.

In block 104, at least one object property description describing an object property in an object property space, for example using object property space coordinates, is received. An object property description may describe any property or properties which may be associated with an object represented by the data, such as appearance properties (color, transparency, glossiness, etc), conductivity, density, porosity and/or mechanical properties such as strength. An object property description may be defined using the same coordinate system as that used for the geometrical description. However, in other examples, an object property description may be defined in a similar space (for example, having the same number of dimensions) to the geometric space of the geometric description but with a different coordinate system, a different origin, or a different scale (for example, a proportional scale varying between a maximum and minimum, rather than an absolute scale). In further examples, the object property space may be different from that of the geometric space, for example comprising more or fewer dimensions.

In block 106, the object property space and the geometric space are intersected to define an object model (block 108), in which an object property is defined at the location of at least one intersection between a described object property and defined object geometry.

When ascribing properties to an object, it may be case that each location which is defined geometrically also has its properties defined. However, in the method of FIG. 1, the object properties are initially instead defined in object property space, which may have the same or different dimensions to the geometric shape, and may have the same or different coordinates. Therefore, the object property description is de-coupled from the geometric description. This allows the same object description to be used with a plurality of geometric descriptions, and can also result in economical memory usage.

There may be an implicit or explicit mapping between locations in the geometric space and locations in the object property space (however complex/high-dimensional object space may be). In particular, each location in a geometric space of an object may have a mapping with a location in an object property space, which defines the object properties at that geometric location.

To consider a simple example, assume that the object to be described is a self-righting round bottomed doll figure. The shape to be described may be complex, having facial features, and a curved underside, and therefore many vertices may be defined to fully represent the intended shape. In this example, these are defined in XYZ space, each vertex having a set of coordinates $[x,y,z]_i$. However, a density model of the object is simple, having a first density below a level in the figure and a second, lower, density above it.

Although many vertices may be specified to describe the doll in geometric space, the density at each of these vertices will be one of two values. Storing an density value for each geometric vertex is therefore inefficient. Instead, in this example, separately holding a cuboid which fully encloses the doll, or indeed a single axis, which has a low density specified for an upper region and a high density specified for a lower region, may make more economical use of memory. If control data is to be generated to allow generation of an object, the data can be combined at that time (for example aligning the change in density defined along an axis with height in the doll). However, until that point, an economically sized object model may be held.

In this particular example, using the same coordinate space as in the geometrical model may be a reasonable option but this may not be the case. If for example the density of an object was to reduce with distance from a particular point, polar coordinates may be more appropriate. In other examples, a gradient or other value function of a property may be specified independently of an object and then scaled to a particular object size. In another example may be more economical to define a surface differently than in a model object, for example using a different set of polygons (e.g. using a quadrilateral, rather than a triangular, mesh), or to use a different scale or have a different origin, or to specify an object property space having a domain that exceeds that of the geometrical object. In some examples, an object property may have a functional definition. For example, rather than a property defined explicitly at a specific location L in any arbitrary coordinate system, it may be defined as a function f(L), without any one location being specified.

Figure 2:
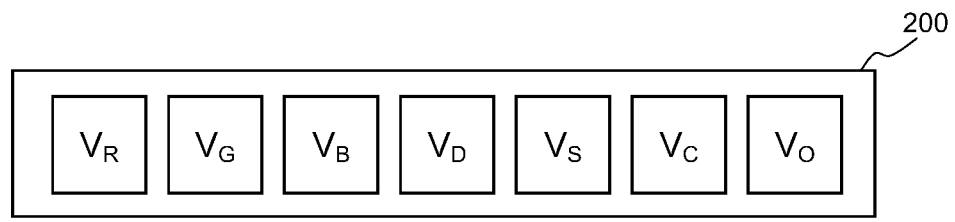
FIG. 2 is a schematic representation of an example of an object property description.

In some examples, an object property description comprises at least one object property value data object. An example of an object property data object 200 as shown schematically in FIG. 2. In this example, the set of properties comprises three color values $V_R$, $V_G$, $V_B$, representing Red, Green and Blue color values, a Density value $V_D$, a stiffness value $V_S$, a conductivity value $V_C$ and an opacity value $V_O$. Other sets of object properties may be described, and may comprise any of the properties mentioned above as well as any of, amongst others: a flexibility; elasticity; rigidity; surface roughness; porosity; strength, or the like.

In some examples, a value set is predetermined for each property and the value is taken from the set. For example, a bit depth may be specified for each property. For the set of values shown in FIG. 2, the bit depth may for example be specified as [8, 8, 8, 5, 4, 1, 6], i.e. the color values are specified with 8 bit resolution, 5 bits (32 level resolution) for the density values, 4 bits (16 level resolution) for stiffness values, 1 bit (on/off) for conductivity, and 6 bits (64 level resolution) for opacity. This would result in a 5-byte encoding of the seven property data object.

However, in other examples, the object property description could take any form, including an instruction for a particular combination of materials/agents to be used in fabricating an object having the described property or properties. In examples in which a location represents a region of the object, the object property description may comprise an indication of at least one object property which varies within the region. For example, instead of being an indication of a single property, it could comprise an indication of a property gradient or other function.

In some examples, a plurality of separate object property descriptions could be provided, each representing one or a subset of the object properties for an object.

In a particular example, an object property description comprises an indexed array of unique object property value data objects and a set of locations associated with an index of the indexed array. This may remove redundancy as each unique data object is described once rather than multiple times and referred to, possibly for a plurality of locations/regions, with an associated index.

A conversion, translation and or transformation of an object property space to a geometric space may also be carried out.

Figure 3:
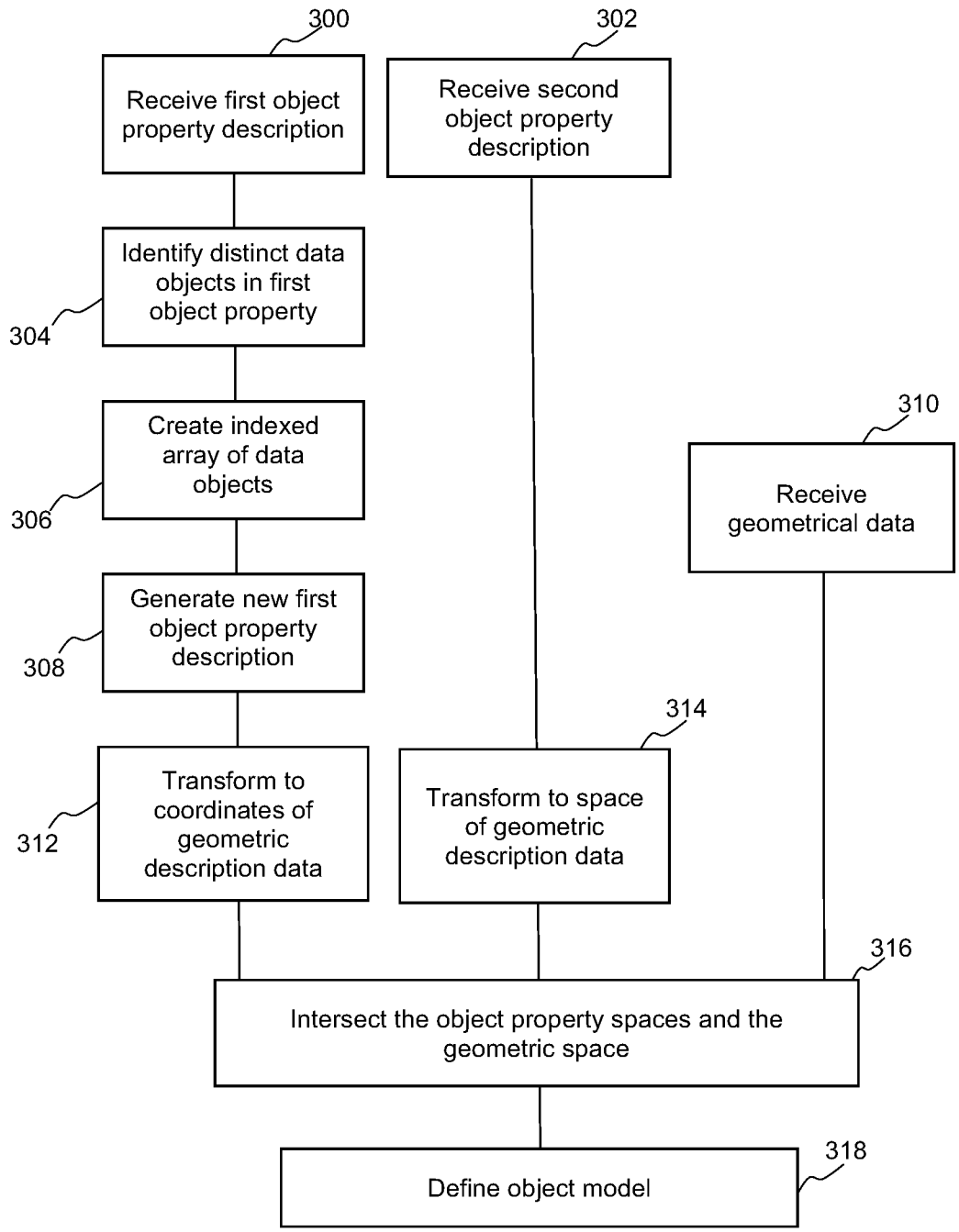
FIG. 3 is a flowchart of an example of a method for defining an object property model.

FIG. 3 comprises a method of processing data comprising, in receiving a first (block 300) and a second (block 302) object property descriptions, The first object property description comprises object property value data objects associated with each of a plurality of locations within a first object property space. The first object property in one example is defined in three-dimensional space using polar coordinates. The second object property description comprises an indication of discrete locations in a second dimensional space, in one example indicating a property that varies in one dimension (for example, along the length of an object).

In block 304, distinct object property value data objects within the first object property description are found. An indexed array is populated with the distinct object property value data objects, such that data indicative of each distinct object property value data objects is stored at a different index within the array (block 306). In block 308, a new object property description is generated, the new object property description comprising an index associated with each of the plurality of locations within the object property space, wherein the index corresponds to the index of the object property value data object for that location.

In block 310, data representing a geometrical description of an object is received. The geometry of an object is defined in three-dimensional space using Cartesian coordinates with indications of distances given in a standard manner (in one example, millimetres). In this example, the data comprises a plurality of geometric vertices, each indicative of a point in geometric space.

In block 312, the coordinates of the first object property description are transformed into those of the geometric description (in one example, from polar to Cartesian).

In block 314, the second object property description is converted from the second object property space into the three-dimensional geometric space used to provide the geometric description. This conversion may comprises any, or any combination of a transformation, a translation, a rescaling, an alignment, or the like. In an example in which a property varies in one dimension, this may comprise generating a description which is consistent in two dimensions, but varies in the third, and which is sized to match the geometric description—for example if the second object property comprises a linearly varying value for transparency, such that an object is intended to vary from opaque at its base to transparent at its top, the one dimensional description could be used to generate a three-dimensional model where any XY slice taken parallel to a Z axis would represent the same transparency. In other examples, an origin, or arbitrary points in the different spaces, may be aligned.

In block 316, the object property spaces and the geometric space, now having the same dimensionality and coordinate systems, are intersected. An object model is generated (block 318), the object model comprising the plurality of geometric vertices and at least one non-geometric vertex defining at least one object property at an intersection. Where an object property is defined as a function (for example, a function of location L, f(L)), then interpolation (for example piece-wise linear interpolation) may be used to derive points of intersection. In some examples, the density of the interpolated points may depend on the non-linearity of f(L).

Figure 4:
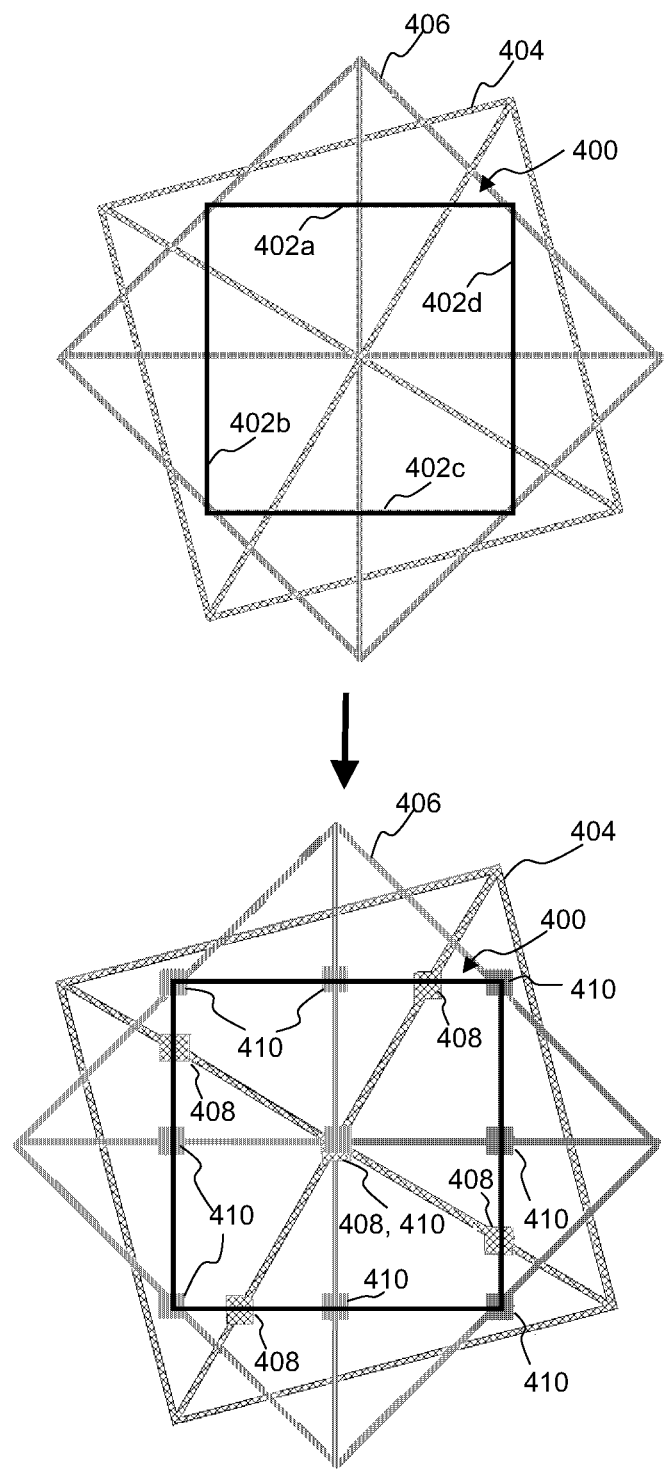
FIG. 4 is a schematic example representation of intersections of a geometric model and object property descriptions.

Intersection of two object property spaces and a geometric space is illustrated schematically in FIG. 4. In FIG. 4, a geometric model is a cube 400 (shown in cross section). The cube is defined by values at its vertices, and by vectors linking the vertices to define the edges (as represented by lines 402a, b, c, d), and therefore to define the faces. An object opacity description 404 is also provided, in this example, the object opacity description space is also a cube—shown in cross section as a square—which has a base parallel to the geometric model cube 400, but is relatively rotated thereto about a central axis. The object opacity description 404 has values explicitly specified at its eight vertices, and intermediate values are derivable by interpolation. The object opacity description 404 specifies that the object is made up of four different opacity levels which are offset from its faces. An object colour description 406 is also provided, in this case another relatively rotated cube, specifying four colors such each face comprises a first and second color.

In some examples, an object property description may be a fully or partially defined vector model. In other examples, the properties may be defined at at least one point, for example with an explicit or implicit tessellation. An implicit tessellation may for example be a Delaunay tessellation, or another predetermined tessellation. In some examples, interpolation of specified object properties may be used to fill geometric model space, or to generate object property values at a point of intersection. If a location within geometric model space is outside the scope of properties, extrapolation (for example replication) may be used to define an object property value at that point, or a default value may be used or the property may be undefined.

In this example, the models are aligned by performing an origin to origin transformation, which has the effect of providing a shared origin or, in this example, aligning the centre point. In other examples, the centre point may not be aligned. For example, the models may be in some other way to establish coordinate correspondence (for example by specifying that coordinates $[a_1, b_2, c_3]$ in one geometry are matched to coordinates $[x_i, y_j, z_k]$ in another, carrying out appropriate scaling and the like).

Where the geometric model coincides with an object property description, and, in this example, where the two object property descriptions coincide, any object property values are noted. In this example, opacity values are defined at various points 408 and color values are noted at points 410. The actual values at these points may differ. At a central point, which is not explicitly defined in the geometric model 400, both values are defined.

In this example, object values are stored as non geometric vertices. For example, non geometric vertices at points 408, 410 may be characterised by a data object having the form [RGBO], such that the non geometric vertices at points 408 may be expressed as $[-,-,-,V_O]$, whereas the non geometric vertices at points 410 may be expressed as $[V_R, V_G, V_B, -]$, and the central data object may be expressed as $[V_R, V_G, V_B, V_O]$. In some examples, some or all of the points could be described as plurality of object description vectors, wherein the vectors are based on the object properties indicated at the points of intersection, either with the geometric model or with each other. This means that the shape-geometry defining [x, y, z] coordinates may contribute to the definition of shape, and also act as object property holding vertices.

In other examples, a variety of samplings may be made across portion of each property space which coincides with the geometric space occupied by the model. This may result in a plurality of partially populated object property data object defined as vectors. For example at a location where opacity is specified $RGBDFCO_i=[-, -, -, -, -, V_O]$, while elsewhere where color is specified $RGBDFCO_i=[V_R, V_G, V_B, -, -, -, -]$. Where every property is fully defined at every location, a fully populated object property data object may be defined for each location, e.g. $RGBDFCO_i=[V_R, V_G, V_B, V_D, V_F, V_C, V_O]$. The combination of properties defined for different objects, and hence the structure of the data object, may vary.

In some examples, there may be trade-off between an increase in spatial-geometry (shape) vertices (adding non-geometric vertices to a geometric description that describe non-spatial features, instead holding object property information) and defining vectors. These may be used in combination or individually, for example depending on the most economical data representation.

Figure 5:
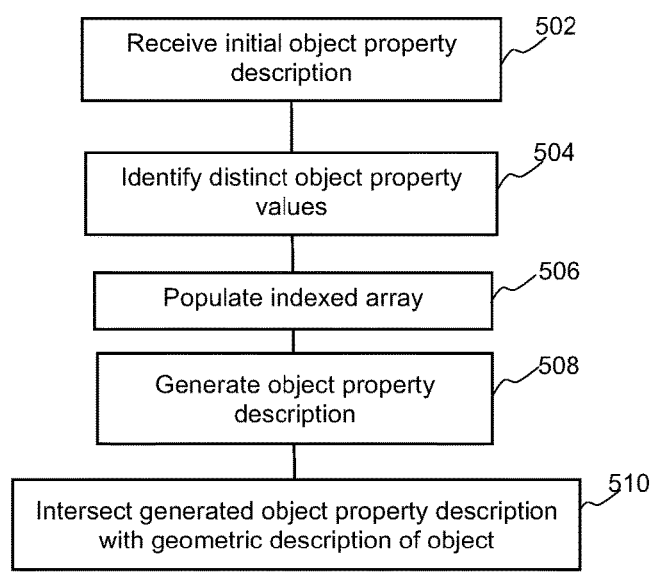
FIG. 5 is a flowchart of an example of a method associating an object property description with an object model.

A method of associating an object property description with a geometric description of a three-dimensional object is shown in FIG. 5. In this example, in block 502, an initial object property description comprising a plurality of object property value data objects, each associated with one of a plurality of locations within object property space is received. In some examples, this may comprise a model object in which each specified volume and/or location is associated with a description (i.e., the geometric object space may be the same as the object property space). In other examples, the object property description may be supplied in isolation from any geometric description of an object.

In block 504, distinct object property value data objects are identified. This may be carried out on the object properties as a set (i.e. finding distinct object property value combinations), or for each specified property (for example, finding distinct color values, distinct opacity values, etc.).

In block 506, an indexed array is populated with the distinct object property value data objects, such that data indicative of each distinct object property value data object is stored at a different index within the array. In block 508, a new object property description is generated, in which the data comprises an index associated with each of the plurality of locations within the object property space and the index corresponds to the index of the object property value data object for that location. In block 510, the generated object property description is intersected with a geometric description of a three-dimensional object.

Not all possible properties, and not all possible combinations of properties, are likely to be seen in any given object property space used to describe a possible gamut of values which that property may have. If all possible property combinations were to be stored, the memory space taken up would be very large. Taking the bit depth examples set out above, for color description in an RGB domain at 8-bits the total possible address space is $256^3$. Adding two additional 8-bit encoded properties, such as e.g. structure and opacity would result in an address space of $256^5$ (i.e. ~$10^{12}$). However, for a given object property description, this space is likely to be sparsely populated by values to be represented in a particular object. In addition, a first object property may have a large range of values and a second object property may have a small range (or be entirely homogenous)

Therefore, by populating a data object (which may be database, held in a memory of the like), with distinct object property value data objects for a particular object property description (i.e. not including repeated items as separate entries), each stored at a different memory address, the address space taken up is sized for the property description under consideration, which takes up less memory space than the entire set of possible object property descriptions.

As explained above, in some examples, the geometric description is a description of the geometry of a three-dimensional object in a geometric space, and the locations within an object property space be converted to locations a geometric space, for example by conversion of a coordinate system, or by scaling, or the like.

Figure 6:
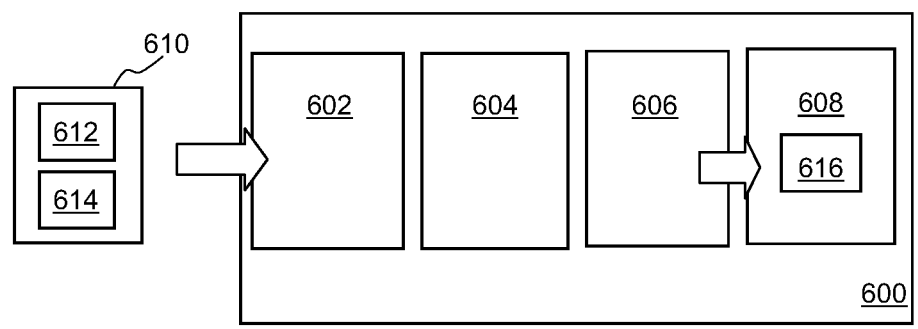
FIG. 6 is a simplified schematic of an example of processing apparatus.

FIG. 6 shows an example of processing apparatus 600 that may be used to generate control data for production of a three-dimensional object. The apparatus 600 in this example comprises an interface 602, a conversion module 604, model generator 606, and a memory 608.

In the example of FIG. 6, the data representing a three-dimensional model object 610 comprises a geometric description 612 and object property data 614. The geometric description 612 may define a three-dimensional model of at least a portion of the model object 610. The geometric description 612 may define the shape and extent of all or part of an object in a three-dimensional co-ordinate system, e.g. the solid portions of the object. The geometric description 612 may for example be generated by a computer aided design (CAD) application. Object property data 614 defines at least one object property for the three-dimensional object to be generated. In one case, the object property data 614 may define any, or any combination of: color, flexibility, elasticity, rigidity, surface roughness, porosity, inter-layer strength, density, conductivity and the like for at least a portion of the object to be generated. In one example, it may comprise a plurality of data objects as described in relation to FIG. 2. The object property data 614 may also be used to define one or multiple object properties for a portion or portions of an object.

The interface 602 receives the data 612, 614 representing the three-dimensional model object 610. In some examples, the interface 602 may receive the geometric description 612 and the object property data 614 as a single file; in other examples the interface 602 may receive portions of the geometric description 612 and/or the object property data 614 as multiple data objects, wherein the geometric description 612 and the object property data 614 are distributed across a number of associated data structures. In one example, the geometric description 612 may comprise voxels that are defined in a three-dimensional (also referred to herein as [x,y,z]) space. A given voxel may have associated data that indicates whether a portion of the model object 610 is present at that location. The voxels may be of the same or different shapes and/or sizes. The object property data 614 may comprise global and local object property data, e.g. certain object property values as defined in the object property data 614 may be associated with each voxel that defines the object and/or certain object property values may be associated with a set of voxels, e.g. ranging from individual voxels to all voxels associated with the object.

The conversion module 604 expresses the object property data in geometric space if the object property space is specified differently to the geometric space of the geometric description 612, which therefore provides a canonical coordinate system. This may comprise converting the object property data into the geometric data, for example by mapping it to a new coordinate system, scaling the data, expanding the data, aligning an origin or other points in the spaces, or the like.

The model generator 606 combines the geometric description 612 and the object property data 614 by intersecting the geometric description and the object property data 614 and assigning object properties to the geometric description 612 to generate a model 616 comprising associated object property descriptions. Where the geometric description 612 comprises an array of voxels, the model generator may assign an object property to a voxel.

The resulting model 616 is stored in the memory 608.

Figure 7:
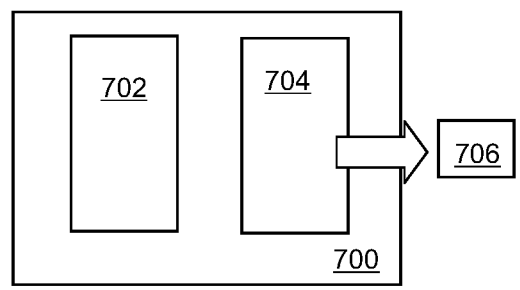
FIG. 7 is a simplified schematic of an example of processing apparatus for generating control data for production of a three-dimensional object.

FIG. 7 shows additional processing apparatus 700, which could be included in the processing apparatus of FIG. 6 in some examples, or may be separate therefrom. The processing apparatus 700 comprises a mapping module 702 to map the data indicative of the object property descriptions to print material coverage representations and a control data module 704 to generate control data from the print material coverage representation.

In this example, the mapping module 702 receives the data object held in the memory 608 (although a different data source may be provided) and maps each object property value or value set therein to at least one print material coverage representation, in this example, at least one material volume coverage (Mvoc) vector. In some examples, where an indexed array of unique values has been created, mapping may be carried out based on the indexed array, or may have been pre-computed, and available for use as a look-up table to provide the print material coverage representation for each object property value or value set.

An Mvoc vector may have a plurality of values, wherein each value defines a proportion for each, or each combination of print materials in an addressable location of a layer of the three-dimensional object. For example, in an additive manufacturing system with two available print materials (for example, agents)—M1 and M2, where each print material may be independently deposited in an addressable area of a layer of the three-dimensional object, there may be $2^2$ (i.e. four) proportions in a given Mvoc vector: a first proportion for M1 without M2; a second proportion for M2 without M1; a third proportion for an over-deposit (i.e. a combination) of M1 and M2, e.g. M2 deposited over M1 or vice versa; and a fourth proportion for an absence of both M1 and M2. In this case an Mvoc vector may be: [M1, M2, M1M2, Z] or with example values [0.2, 0.2, 0.5, 0.1]—i.e. in a given [x, y] location in a z slice, 20% M1 without M2, 20% M2 without M1, 50% M1 and M2 and 10% empty. As each value is a proportion and the set of values represent the available material combinations, the set of values in each vector sum to 1 or 100%.

For example, in a case where the agents are colored, then the Mvoc vector may be determined to generate select agent combinations that generate a match with a supplied object property, e.g. a supplied RGB value. In some examples the mapping between an Mvoc vector and the supplied object properties may be held in a lookup table, or may be specified on an individual basis.

The control data module 704 operates on the print material coverage representation using halftone data, in one example having at least one stored halftone threshold matrix having the same dimensions as specified for the object 610. Specifically, in this example, the print material coverage representation is compared with the threshold values of the threshold matrix representing the same three-dimensional location to generate control data 706 for printing a three-dimensional object based on the model object. The control data 706 may for example be in the form of a set of discrete print material choices for a pixel in a plane, wherein the discrete values across the area of the plane may be representative of proportions set out in the print material coverage representation.

Examples in the present disclosure can be provided as methods, systems or machine readable instructions, such as any combination of software, hardware, firmware or the like. Such machine readable instructions may be included on a computer readable storage medium (including but not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each flow and/or block in the flow charts and/or block diagrams, as well as combinations of the flows and/or diagrams in the flow charts and/or block diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus, such the processing apparatus 600, 700 may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices provide a means for realizing functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It should be noted that the above-mentioned examples illustrate rather than limit what is described herein, and that those skilled in the art will be able to design many alternative implementations without departing from the scope of the appended claims. In particular, a feature or block from one example may be combined with or substituted by a feature/block of another example The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
   receiving data representing a geometrical description of a three-dimensional object defining, in a geometric space, an object geometry of the three-dimensional object;
   receiving at least one object property description describing, in an object property space, an object property of the three-dimensional object; and
   intersecting the object property space and the geometric space to define an object model of the three-dimensional object, wherein the object model comprises at least one object property of the three-dimensional object defined at an intersection between a described object property and a defined object geometry of the three-dimensional object.

2. The method according to claim 1, further comprising converting at least one object property description into the geometric space of the geometrical description.

3. The method according to claim 1 wherein the data representing the geometrical description comprises a plurality of geometric vertices, each of the plurality of geometric vertices being indicative of a location in geometric space, and wherein the object model comprises the plurality of geometric vertices and at least one non-geometric vertex defining the at least one object property at the intersection.

4. The method according to claim 1, wherein the object model comprises the geometric description and a plurality of object description vectors, wherein the object description vectors are based on described object properties at an intersection of the object property space and the geometric space.

5. The method according to claim 1, wherein the at least one object property description comprises an indexed array of unique object property value data objects and a set of locations associated with an index of the indexed array.

6. The method according to claim 1, further comprising receiving an initial object property description comprising object property value data objects associated with each of a plurality of locations within the object property space;
identifying distinct object property value data objects from the object property value data objects;
populating an indexed array with the distinct object property value data objects, wherein data indicative of each distinct object property value data object is stored at a different index within the array; and
generating data comprising a new object property description, the data comprising the new object property description comprising an index associated with each of a plurality of locations within the object property space, wherein the index corresponds to the index of the object property value data object for a respective location of the plurality of locations.

7. The method according to claim 1, further comprising receiving a plurality of object property descriptions, each of the plurality of object property descriptions describing at least one object property of the three-dimensional object.

8. A method comprising:
receiving an initial object property description comprising object property value data objects associated with each of a plurality of locations within an object property space;
identifying distinct object property value data objects from the object property value data objects;
populating an indexed array with the distinct object property value data objects, wherein data indicative of each distinct object property value data object is stored at a different index within the array;
generating an object property description comprising an index associated with each of the plurality of locations within the object property space, wherein the index associated with each of the plurality of locations within the object property space corresponds to the index of the object property value data object for that location; and
intersecting the generated object property description with a geometric description of a three-dimensional object.

9. The method according to claim 8, wherein the geometric description is a description of the geometry of the three-dimensional object in a geometric space, and the method comprises converting the locations within the object property space to locations within the geometric space.

10. The method according to claim 8, wherein the geometric description is a description of the three-dimensional object in a geometric space using a geometric coordinate system, and wherein the locations within the object property space are specified as coordinates in an object space coordinate system, and wherein the method further comprises converting the coordinates of the object space coordinate system into coordinates of the geometric coordinate system.

11. A processing apparatus, comprising:
an interface to receive object model data, the object model data comprising a geometric description of a three-dimensional object in a geometric space, and object property data describing at least one object property of the three-dimensional object across an object property space;
a processor; and
a memory on which are stored instructions that when executed by the processor are to cause the processor to:
express the object property data in the geometric space when the object property space is specified differently from the geometric space of the geometric description; and
combine the geometric description and the object property data by intersecting the geometric description and the object property data and assigning object properties of the object property data to the geometric description of the three-dimensional object.

12. The processing apparatus according to claim 11, wherein the geometric description comprises an array of voxels and the instructions are further to cause the processor to assign an object property to a voxel of the array of voxels.

13. The processing apparatus according to claim 11, wherein the instructions are further to cause the processor to map data indicative of an object property to a print material coverage representation.

14. The processing apparatus according to claim 13, wherein the instructions are further to cause the processor to generate control data from the print material coverage representation.

15. The processing apparatus according to claim 14, wherein the control data comprises a set of discrete print material choices.

* * * * *

UNITED STATES PATENT AND TRADEMARK OFFICE
CERTIFICATE OF CORRECTION

| | |
|---|---|
| PATENT NO. | : 10,424,109 B2 |
| APPLICATION NO. | : 15/544775 |
| DATED | : September 24, 2019 |
| INVENTOR(S) | : Peter Morovic et al. |

It is certified that error appears in the above-identified patent and that said Letters Patent is hereby corrected as shown below:

In Column 11, Line 7, in Claim 3, delete "claim 1" and insert -- claim 1, --, therefor.

Signed and Sealed this
Tenth Day of December, 2019

Andrei Iancu
*Director of the United States Patent and Trademark Office*